United States Patent
Wang et al.

(10) Patent No.: US 9,691,834 B2
(45) Date of Patent: Jun. 27, 2017

(54) AMOLED ARRAY SUBSTRATE, PRODUCING METHOD THEREOF AND DISPLAY APPARATUS

(71) Applicant: BOE Technology Group Co., Ltd., Beijing (CN)

(72) Inventors: Jiliang Wang, Beijing (CN); Zhongjun Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/648,191

(22) PCT Filed: Aug. 28, 2014

(86) PCT No.: PCT/CN2014/085411
§ 371 (c)(1),
(2) Date: May 28, 2015

(87) PCT Pub. No.: WO2015/165184
PCT Pub. Date: Nov. 5, 2015

(65) Prior Publication Data
US 2016/0268361 A1 Sep. 15, 2016

(30) Foreign Application Priority Data
Apr. 30, 2014 (CN) .......................... 2014 1 0183223

(51) Int. Cl.
*H01L 27/32* (2006.01)
(52) U.S. Cl.
CPC ...... *H01L 27/3265* (2013.01); *H01L 27/3246* (2013.01); *H01L 27/3276* (2013.01); *H01L 27/3262* (2013.01); *H01L 2227/323* (2013.01)
(58) Field of Classification Search
CPC . H01L 27/12; H01L 27/1266; H01L 27/3262; H01L 29/78675; H01L 29/78678;
(Continued)

(56) References Cited

U.S. PATENT DOCUMENTS

2001/0026123 A1 10/2001 Yoneda
2003/0141811 A1 7/2003 Park et al.
(Continued)

FOREIGN PATENT DOCUMENTS

CN 101009309 A 8/2007
CN 102945828 A 2/2013
(Continued)

OTHER PUBLICATIONS

Office Action from Chinese Patent Application No. 201410183223.6, dated Mar. 15, 2016.
(Continued)

*Primary Examiner* — Cuong Q Nguyen
(74) *Attorney, Agent, or Firm* — Westman, Champlin & Koehler, P.A.

(57) ABSTRACT

The present disclosure provides an active matrix organic light-emitting diode array substrate comprising: a substrate; a plurality of pixel units located on the substrate and arranged in an array, each of the plurality of pixel units comprising a thin film transistor, an organic light-emitting diode and a bottom plate of a storage capacitor; a pixel definition layer spacing apart two adjacent pixel units from each other; and a top plate of the storage capacitor provided on the pixel definition layer, the top plate of the storage capacitor being spaced apart from the bottom plate of the storage capacitor by the pixel definition layer. The bottom plate is arranged above a gate electrode of the thin film transistor and electrically connected to the gate electrode of the thin film transistor.

20 Claims, 3 Drawing Sheets

(58) Field of Classification Search
CPC ............. H01L 27/3225; H01L 27/3246; H01L 27/3251; H01L 27/3265
See application file for complete search history.

(56) References Cited

U.S. PATENT DOCUMENTS

| | | | |
|---|---|---|---|
| 2005/0012097 A1* | 1/2005 | Yamazaki | H01L 27/12 257/59 |
| 2005/0236629 A1 | 10/2005 | Lee et al. | |
| 2008/0246027 A1 | 10/2008 | Kim | |
| 2011/0062444 A1* | 3/2011 | Park | H01L 27/1266 257/59 |
| 2015/0243722 A1* | 8/2015 | Kwon | H01L 27/3262 257/40 |

FOREIGN PATENT DOCUMENTS

| | | |
|---|---|---|
| CN | 202905716 U | 4/2013 |
| CN | 103985736 A | 8/2014 |
| CN | 203850301 U | 9/2014 |

OTHER PUBLICATIONS

International Search Report and Written Opinion, including English translation of Written Opinion, for PCT Application No. PCT/CN2014/085411, dated Jan. 30, 2015, 14 pages.
Second Office Action for Chinese Patent Application No. 201410183223.6, dated Jun. 22, 2016, 12 pages.
Third Office Action for Chinese Patent Application No. 201410183223.6, dated Oct. 17, 2016, 12 pages.
Rejection Decision for Chinese Patent Application No. 201410183223.6, dated Feb. 27, 2017, 13 pages.

\* cited by examiner

AMOLED ARRAY SUBSTRATE, PRODUCING METHOD THEREOF AND DISPLAY APPARATUS

This application is a Section 371 National State Application of International Application No. PCT/CN2014/085411, filed 28 Aug. 2014, entitled "AMOLED ARRAY SUBSTRATE, PRODUCING METHOD THEREOF AND DISPLAY APPARATUS, which has not yet published, which claims priority to Chinese Patent Application No. 201410183223.6 filed on Apr. 30, 2014 with the State Intellectual Property Office of China, the contents of which are incorporated herein by reference in their entirety.

BACKGROUND OF THE INVENTION

Field of the Invention

The present disclosure relates to the technical field of display, in particular, relates to an AMOLED array substrate, a producing method thereof and a display apparatus.

Description of the Related Art

OLED (organic light-emitting diode abbreviated as OLED) may be classified into two categories, that is, a passive matrix (abbreviated as PM) PMOLED and an active matrix (abbreviated as AM) AMOLED, depending on its driving modes. The AMOLED may be classified into two types, that is, a top emitting type (light emitting from a top substrate) and a bottom emitting type (light emitting from a bottom substrate), depending on its light emitting mode.

As illustrated in FIGS. 1-2, in an arrangement of the conventional AMOLED array substrate, a storage capacitor 100 is designed between a gate electrode 2 and a source electrode 3 of a thin film transistor 30. The parts of the gate electrode 2 and the source electrode 3 facing each other serve as two plates of the storage capacitor 100 and a gate insulation layer 6 is used as a dielectric layer. Due to non-transparency of the materials of the gate electrode 2 and the source electrode 3, the storage capacitor 100 having a large area occupies a very large light emitting area so as to cause a low pixel aperture opening ratio (the pixel aperture opening ratio means a ratio of the light emitting area of a pixel to the total area of the pixel); secondly, the plate of the storage capacitor 100 and the gate lines or data lines are located in the same layer and thus a large parasitic capacitance between them will be produced so as to degrade the transmission and accuracy of the data signals. Again, as the plate of the storage capacitor 100 is connected to the source electrode 3 of the thin film transistor 30, the potential of the source electrode 3 is associated with a current flowing through the thin film transistor 30. And the potential of the source electrode 3 may vary as the current of the thin film transistor 30 varies. Thus, it tends to cause distortion of writing data signals. The brightness of the AMOLED display screen may change abruptly after it is lit. In this way, the brightness of the pixels cannot meet the requirement for brightness of the grey scaling signals and the display effects will become poor.

SUMMARY OF THE INVENTION

An embodiment of the present invention provides an AMOLED array substrate and a method for producing the same and a display apparatus such that the pixel aperture opening ratio of the display apparatus can be improved and the display quality can be improved.

An active matrix organic light-emitting diode array substrate provided by an embodiment of the present invention comprises: a substrate; a plurality of pixel units located on the substrate and arranged in an array, each of the plurality of pixel units comprising a thin film transistor, an organic light-emitting diode and a bottom plate of a storage capacitor, the bottom plate being arranged above a gate electrode of the thin film transistor and electrically connected to the gate electrode of the thin film transistor; a pixel definition layer spacing apart two adjacent pixel units from each other; and a top plate of the storage capacitor provided on the pixel definition layer, the top plate of the storage capacitor being spaced apart from the bottom plate of the storage capacitor by the pixel definition layer. The top plate of the storage capacitor may be electrically connected to a top electrode of the organic light-emitting diode.

In the technical solution of the embodiment of the present invention, the top plate of the storage capacitor may be spaced apart from the bottom plate of the storage capacitor by the pixel definition layer. The part of pixel definition layer located between the top plate and the bottom plate of the storage capacitor is used as a dielectric layer of the storage capacitor. As the pixel definition layer has occupied a certain light emitting area in itself, the top and bottom plates of the storage capacitor provided on both sides of the pixel definition layer will not need to occupy extra light emitting area. Thus, the area of opaque gate electrode and source electrode may be designed to become relatively small so as to improve the pixel aperture opening ratio of the display apparatus significantly.

In accordance with an embodiment of the present invention, the organic light-emitting diode has a top electrode above the bottom plate of the storage capacitor and the part of the top electrode of the organic light-emitting diode facing the bottom plate severs as the top plate of the storage capacitor.

In the technical solution of the embodiment of the present invention, the top plate of the storage capacitor may be spaced apart from the bottom plate of the storage capacitor by the pixel definition layer. The part of pixel definition layer located between the top plate and the bottom plate of the storage capacitor is used as a dielectric layer of the storage capacitor. As the pixel definition layer has occupied a certain light emitting area in itself, the top and bottom plates of the storage capacitor provided on both sides of the pixel definition layer will not need to occupy extra light emitting area. Thus, the area of opaque gate electrode and source electrode may be designed to become relatively small so as to improve the pixel aperture opening ratio of the display apparatus; further, the top and bottom plates of the storage capacitor are not electrically connected to the source electrode of the thin film transistor such that the data transmission has a good stability. It facilitates to achieve the brightness required for displaying an input signal by the display apparatus and thus the display quality may be further improved.

In accordance with an embodiment of the present invention, the bottom plate of the storage capacitor and a bottom electrode of the organic light-emitting diode are made from the same material and located in the same layer.

By means of the technical solution of the above embodiment, the bottom plate of the storage capacitor and the bottom electrode of the organic light-emitting diode may be formed in the same patterning process without adding the manufacturing costs.

In accordance with an embodiment of the present invention, the bottom plate of the storage capacitor and the gate electrode of the thin film transistor are electrically connected with each other through vias in a first insulation layer.

The solution may achieve reliable connection between the bottom plate of the storage capacitor and the gate electrode. Further, the top and bottom plates of the storage capacitor are not arranged in the same layer in which the data lines and the gate lines are located. It reduces the parasitic capacitance significantly and improves the accuracy of the transmission of data signal.

In accordance with an embodiment of the present invention, in the pixel definition layer, the part located between the bottom plate of the storage capacitor and the top plate of the storage capacitor has a minimum thickness.

The solution may reduce the area the storage capacitor occupies while meeting the requirement of electrical performance of products. It contributes to further optimization of structure.

In accordance with an embodiment of the present invention, the material of the pixel definition layer comprises organic resin or silicon dioxide.

An embodiment of the present invention also provides a display apparatus comprising the active matrix organic light-emitting diode array substrate as described in any of the above embodiments.

The display apparatus has a high pixel aperture opening ratio and a good display quality.

An embodiment of the present invention further provides a method for producing an active matrix organic light-emitting diode array substrate, comprising steps of forming a thin film transistor, an organic light-emitting diode and a bottom plate of a storage capacitor on a substrate, in particular, comprising the following steps of:

forming a pattern of a bottom plate of a storage capacitor electrically connected with a gate electrode of the thin film transistor;

forming a pattern of a pixel definition layer overlaying the bottom plate of the storage capacitor; and forming a pattern of a top plate of the storage capacitor on the pixel definition layer.

The top plate of the storage capacitor may be electrically connected to atop electrode of the organic light-emitting diode.

By means of the above technical solutions, the areas of the gate electrode and the source electrode of the thin film transistor may be designed to become relatively small. The active matrix organic light-emitting diode array substrate produced by the method has a significantly increased pixel aperture opening ratio, so that the display apparatus has a significantly improved display quality.

In accordance with an embodiment of the present invention, the step of forming the pattern of the top plate of the storage capacitor on the pixel definition layer comprises: forming a pattern of a top electrode of the organic light-emitting diode above the pixel definition layer, the top electrode of the organic light-emitting diode comprising a part thereof which faces the bottom plate of the storage capacitor and serves as the top plate of the storage capacitor.

By means of the above technical solutions, the areas of the gate electrode and the source electrode of the thin film transistor may be designed to become relatively small. The active matrix organic light-emitting diode array substrate produced by the method has a significantly increased pixel aperture opening ratio, so that the display apparatus has a significantly improved display quality; the top and bottom plates of the storage capacitor are not electrically connected to the source electrode of the thin film transistor such that the data transmission has a good stability. It facilitates to achieve the brightness required for displaying an input signal by the display apparatus and thus the display quality may be further improved.

In accordance with an embodiment of the present invention, the method further comprises: forming a pattern of a bottom electrode of the organic light-emitting diode after the step of forming the thin film transistor on the substrate, the pattern of the bottom electrode of the organic light-emitting diode and the pattern of the bottom plate of the storage capacitor being formed in the same patterning process. The method may increase the pixel aperture opening ratio without adding the manufacturing costs.

In accordance with an embodiment of the present invention, the method further comprises: before forming the pattern of the bottom electrode of the organic light-emitting diode and the pattern of the bottom plate of the storage capacitor, forming a pattern of vias in a first insulation layer connecting the gate electrode of the thin film transistor with the bottom plate of the storage capacitor and a pattern of vias in a second insulation layer connecting the source electrode of the thin film transistor with the bottom electrode of the organic light-emitting diode in the same patterning process.

The method may achieve reliable connection between the bottom plate of the storage capacitor and the gate electrode. And the pattern of the vias in the first insulation layer and the pattern of the vias in the second insulation layer are formed in the same patterning process, without adding the manufacturing cost thereof. Further, the top and bottom plates of the storage capacitor are not arranged in the same layer in which the data lines and the gate lines are located. It reduces the parasitic capacitance significantly and improves the accuracy of the transmission of data signal.

In accordance with an embodiment of the present invention, upon forming a pattern of the pixel definition layer, the part located between the bottom plate of the storage capacitor and the top plate of the storage capacitor is produced to have a minimum thickness. The solution may reduce the area the storage capacitor occupies while meeting the requirement of electrical performance of products. It contributes to further optimization of structure.

REFERENCE NUMERALS

30—thin film transistor 50—organic light-emitting diode 100, 100'—storage capacitor 1—substrate 2—gate electrode 3—source electrode 4—drain electrode 5—active layer 6—gate insulation layer 7—passivation layer 8—planarization layer 9a—bottom plate of storage capacitor 9b—top plate of storage capacitor 10a—bottom electrode of organic light-emitting diode 10b—top electrode of organic light-emitting diode 11—pixel definition layer 12—color photoresist 13—vias in first insulation layer 14—vias in second insulation layer

DETAILED DESCRIPTION OF EMBODIMENTS OF THE INVENTION

In order to improve the pixel aperture opening ratio of a display apparatus and thus to improve the display quality, an embodiment of the present invention provides an active matrix organic light-emitting diode (abbreviated as AMOLED below) array substrate and a method for producing the same and a display apparatus. In the technical solution of the array substrate of the present invention, the top plate of the storage capacitor may be spaced apart from the bottom plate of the storage capacitor by the pixel definition layer. The part of pixel definition layer located between the top plate and the bottom plate of the storage capacitor is used as a dielectric layer of the storage capacitor. As the pixel definition layer has occupied a certain light emitting area in itself, the top and bottom plates of the storage capacitor provided on both sides of the pixel definition layer will not need to occupy extra light emitting area. Thus, the area of opaque gate electrode and source electrode may be designed to become relatively small so as to significantly improve the pixel aperture opening ratio of the display apparatus.

The present invention will be further explained in detail by way of example such that the technical solutions and advantages of embodiments of the present invention become more apparent.

Figure 3:
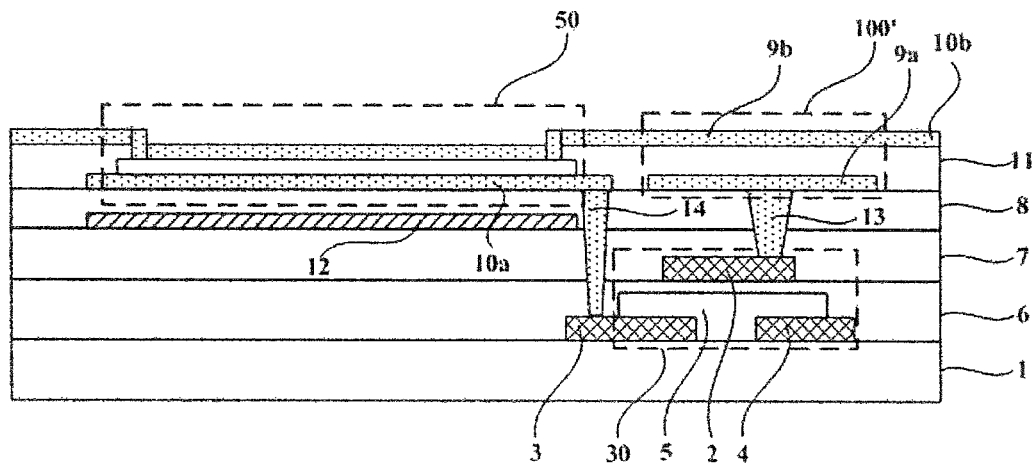
FIG. 3 shows schematically a cross sectional view of a structure of a pixel unit of an AMOLED array substrate according to an embodiment of the present invention.
Figure 4:
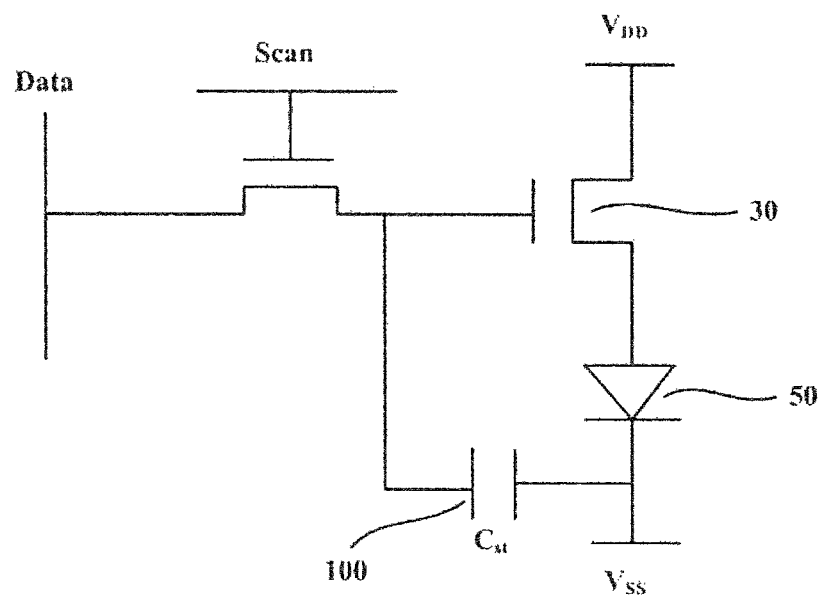
FIG. 4 is a circuit diagram showing schematically a connection arrangement of a storage capacitor of an AMOLED array substrate according to an embodiment of the present invention.

As illustrated in FIGS. 3 and 4, an AMOLED array substrate provided by an embodiment of the present invention includes: a substrate 1; a plurality of pixel units located on the substrate 1 and arranged in an array, each of the plurality of pixel units including a thin film transistor 30, an organic light-emitting diode 50 and a bottom plate 9a of a storage capacitor.

The bottom plate 9a of the storage capacitor is arranged above a gate electrode 2 of the thin film transistor 30 and electrically connected to the gate electrode 2 of the thin film transistor 30.

The array substrate further includes a pixel definition layer 11 spacing two adjacent pixel units from each other; and a top plate 9b of the storage capacitor provided on the pixel definition layer 11. The top plate 9b of the storage capacitor is spaced apart from the bottom plate 9a of the storage capacitor by the pixel definition layer 11. The top plate 9b of the storage capacitor may be electrically connected to a top electrode 10b of the organic light-emitting diode.

In accordance with an embodiment of the present invention, the organic light-emitting diode has a top electrode 10b above the bottom plate 9a of the storage capacitor and the part of the top electrode 10b of the organic light-emitting diode facing the bottom plate 9a forms the top plate 9b of the storage capacitor which is spaced apart from the bottom plate 9a of the storage capacitor by the pixel definition layer 11.

Figure 1:
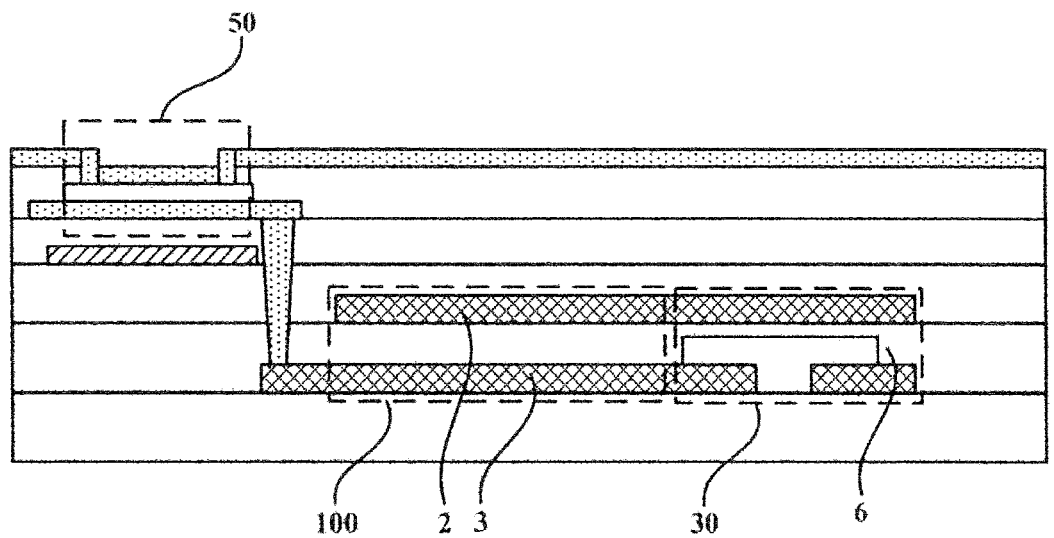
FIG. 1 shows schematically a cross sectional view of a structure of a pixel unit of the conventional AMOLED array substrate.
Figure 2:
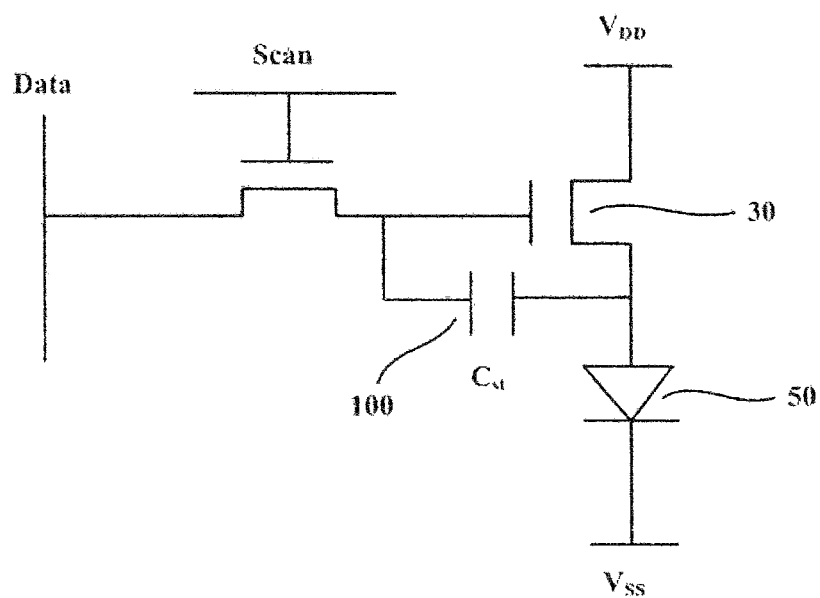
FIG. 2 is a circuit diagram showing schematically a connection arrangement of a storage capacitor of the conventional AMOLED array substrate.

It can be seen from comparison between FIGS. 1 and 3 that in FIG. 1, a partial region of the gate electrode 2 needs to face a partial region of the source electrode 3 so as to form a storage capacitor 100. In order to allow the storage capacitor to have a capacitance value meeting the requirement of design, the partial region of the gate electrode 2 is typically designed to have a large area, thus, it may reduce the aperture opening ratio of pixels. In contrast, in FIG. 3, the top plate of the storage capacitor 100' may be spaced apart from the bottom plate of the storage capacitor 100' by the pixel definition layer 11. The part of pixel definition layer 11 located between the top plate and the bottom plate of the storage capacitor 100' is used as a dielectric layer. As the pixel definition layer 11 has occupied a certain light emitting area in itself, the top and bottom plates of the storage capacitor 100' provided on both sides of the pixel definition layer 11 will not need to occupy extra light emitting area. Thus, the area of opaque gate electrode 2 and source electrode 3 may be designed to become relatively small so as to significantly improve the pixel aperture opening ratio of the display apparatus.

Further, the top and bottom plates of the storage capacitor 100' are not electrically connected to the source electrode 3 of the thin film transistor 30 such that the data transmission has a good stability. It better facilitates to achieve the brightness required for displaying an input signal by the display apparatus and thus the display quality may be further improved.

In accordance with an embodiment of the present invention, the bottom plate 9a of the storage capacitor and a bottom electrode 10a of the organic light-emitting diode are made from the same material and located in the same layer. In this way, the bottom plate 9a of the storage capacitor and the bottom electrode 10a of the organic light-emitting diode may be formed in the same patterning process without adding the manufacturing costs.

With continual reference to FIG. 3, the bottom plate 9a of the storage capacitor and the gate electrode 2 of the thin film transistor 30 are electrically connected with each other through vias 13 in a first insulation layer. The solution may achieve reliable connection between the bottom plate 9a of the storage capacitor and the gate electrode 2. Further, the top and bottom plates of the storage capacitor 100' are not arranged in the same layer in which the data lines and the gate lines are located. It reduces the parasitic capacitance significantly, improves the accuracy of the transmission of data signal and enhances the display quality.

In an embodiment as shown in FIG. 3, the part of the pixel definition layer 11 located between the bottom plate of the storage capacitor 100' and the top plate of the storage capacitor 100' has a minimum thickness. That is, the thickness of the pixel definition layer 11 in the region of the storage capacitor 100' is less than its thickness in other regions. From the calculation formula of a capacitance value of the storage capacitor $$C = \frac{\varepsilon A}{d}$$

(C is a capacitance value, $\in$ is a dielectric constant, A is an area of the plate of the storage capacitor, d is dielectric thickness of the storage capacitor), it can be known that when the storage capacitor has a constant capacitance value, the area of the plate of the storage capacitor is positively proportional to the dielectric thickness of the storage capacitor. Thus, the solution may reduce the area the storage capacitor 100' occupies while meeting the requirement of electrical performance of products. It contributes to further optimization of structure.

In the present disclosure, the construction of the thin film transistor 30 may be of top gate type or bottom gate type. The light emitting arrangement of the organic light-emitting diode 50 may be of top emitting type or bottom emitting type, which is not specifically limited herein. In addition, the organic light-emitting diode 50 may be a light emitting device for emitting red light, green light or blue light, or may be a light emitting device for emitting white light (for colored display, it needs to provide corresponding color photo-resist to filter the white light).

The organic light-emitting diodes 50 in the array substrate shown in FIG. 3 are of bottom emitting type and emit white light. The thin film transistor has a top gate type construction. Each of the pixel units in particular includes: a source electrode 3 and a drain electrode 4 facing each other on the substrate 1; an active layer 5 located above a gap between the source electrode 3 and the drain electrode 4; a gate insulation layer 6 located above the active layer 5; a gate electrode 2 located above the gate insulation layer 6 and facing the active layer 5; a passivation layer 7 overlaying the gate electrode 2; a color photo-resist 12 above the passivation layer 7; a planarization layer 8 overlaying the color photo-resist 12; a bottom plate 9a of the storage capacitor and a bottom electrode 10a of the organic light-emitting diode located above the planarization layer 8. The bottom plate 9a of the storage capacitor is electrically connected with the gate electrode 2 through vias 13 in the first insulation layer (the vias 13 in the first insulation layer pass through the planarization layer 8 and the passivation layer 7). The bottom electrode 10a of the organic light-emitting diode faces the color photo-resist 12 and is electrically connected with the source electrode 3 through the vias 14 in the second insulation layer (the vias 14 in the second insulation layer passes the planarization layer 8, the passivation layer 7 and the gate insulation layer 6). Each of the pixel units further includes other associated function layers (including a light emitting layer, a transmission layer or the like) above the bottom electrode 10a of the organic light-emitting diode. A pixel definition layer 11 is included to space apart two adjacent pixel units from each other, and the part of the pixel definition layer 11 facing the bottom plate 9a of the storage capacitor has a small thickness. And also a top electrode 10b of the organic light-emitting diode is located above the pixel definition layer 11.

The substrate 1 may include a glass substrate, a resin substrate or a plastic substrate or the like. The materials of the gate electrode 2, the source electrode 3 and the drain electrode 4 are not limited herein, for example, may be such as aluminum, copper, molybdenum or the like. The active layer 5 may include the material such as amorphous silicon, polycrystalline silicon or oxide semiconductor (for example indium gallium zinc oxide or hafnium indium zinc oxide). The bottom electrode and top electrode of the organic light-emitting diode 50 and the bottom plate 9a of the storage capacitor may include the material such as indium tin oxide or indium zinc oxide. The gate insulation layer 6 and the passivation layer 7 may include silicon nitride. The planarization layer 8 may include organic resin materials. The pixel definition layer 11 may include such as organic resin or silicon dioxide.

Figure 5:
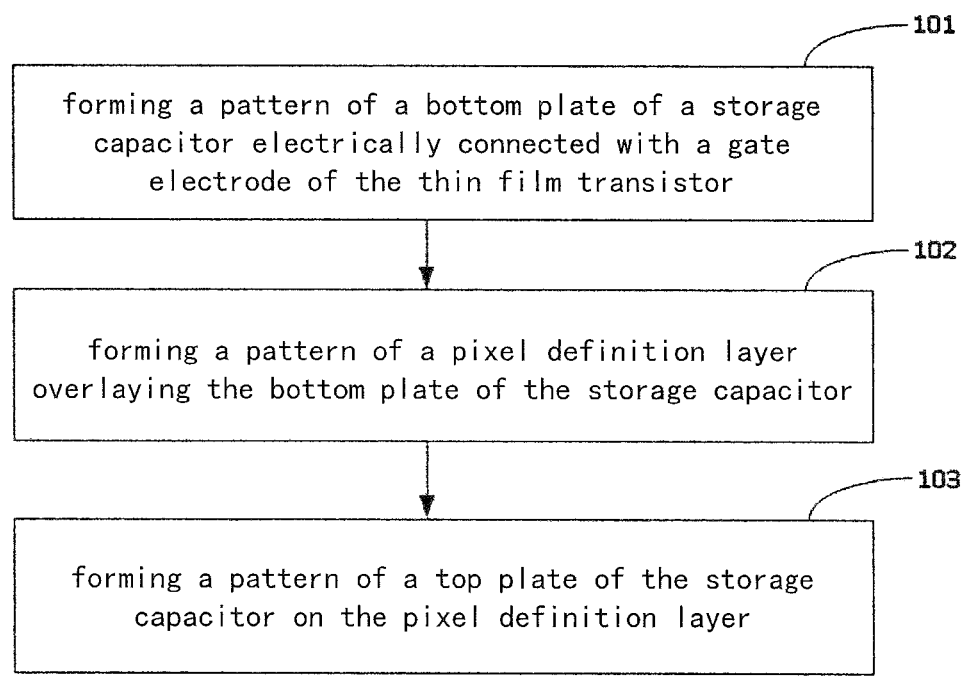
FIG. 5 shows schematically a flow chart of a method for producing an AMOLED array substrate according to an embodiment of the present invention.

As illustrated in FIG. 5, an embodiment of the present invention also provides a method for producing an AMOLED array substrate (with reference to FIG. 3), comprising steps of forming a thin film transistor 30, an organic light-emitting diode 50 and a bottom plate 9a of a storage capacitor on a substrate. In particular, the method specifically includes:

Step 101 of forming a pattern of a bottom plate 9a of a storage capacitor electrically connected with a gate electrode 2 of the thin film transistor 30;

Step 102 of forming a pattern of a pixel definition layer 11 overlaying the bottom plate 9a of the storage capacitor; and Step 103 of forming a pattern of a top plate 9b of the storage capacitor on the pixel definition layer 11.

In accordance with an embodiment of the present invention, the step of forming the pattern of the top plate 9b of the storage capacitor on the pixel definition layer may include: forming a pattern of a top electrode 10b of the organic light-emitting diode above the pixel definition layer 11, the top electrode 10b of the organic light-emitting diode comprising a part thereof which faces the bottom plate 9a of the storage capacitor and forms the top plate of the storage capacitor.

The patterns of the respective film layers on the substrate are typically formed by a patterning process. One patterning process typically includes procedures such as cleaning substrate, film forming, coating photo resist, exposing, developing, etching and peeling off photo resist. A metal layer is typically formed by physical vapor deposition process (for example magnetron sputtering) to form a film and a pattern in the metal layer is formed by a wet etching. A non-metal layer is typically formed by chemical vapor deposition process to form a film and a pattern in the non-metal layer is formed by a dry etching. The respective function layers of the organic light-emitting diode may be formed by vapor deposition.

In the AMOLED array substrate produced by the above method, the areas of the gate electrode 2 and the source electrode 3 of the thin film transistor 30 may be designed to become relatively small. The AMOLED array substrate produced by the method has a significantly increased pixel aperture opening ratio so that the display quality of the display apparatus is significantly improved; the top and bottom plates of the storage capacitor 100' are not electrically connected to the source electrode 3 of the thin film transistor 30 such that the data transmission has a good stability. It facilitates to achieve the brightness required for displaying an input signal by the display apparatus and thus the display quality may be further improved.

In accordance with an embodiment of the present invention, during producing the AMOLED array substrate, after forming the thin film transistor on the substrate, it further needs to form a pattern of a bottom electrode 10a of the organic light-emitting diode. In accordance with an embodiment of the present invention, the pattern of the bottom electrode 10a of the organic light-emitting diode and the pattern of the bottom plate 9a of the storage capacitor are formed in the same patterning process (i.e., it may use a common mask). The method may increase the pixel aperture opening ratio without adding the manufacturing costs.

Further, before forming a pattern of the bottom electrode 10a of the organic light-emitting diode and the pattern of the bottom plate 9a of the storage capacitor, a pattern of vias 13 in a first insulation layer connecting the gate electrode 2 of the thin film transistor 30 with the bottom plate 9a of the storage capacitor and a pattern of vias 14 in a second insulation layer connecting the source electrode 3 of the thin film transistor 30 with the bottom electrode 10a of the organic light-emitting diode are formed in the same patterning process. The method may achieve reliable connection between the bottom plate 9a of the storage capacitor and the gate electrode 2. And the pattern of the vias 13 in the first insulation layer and the pattern of the vias 14 in the second insulation layer are formed in the same patterning process (i.e., it may use a common mask) without adding the manufacturing costs. Further, the top and bottom plates of the storage capacitor 100' are not arranged in the same layer in which the data lines and the gate lines are located. It reduces the parasitic capacitance significantly and improves the accuracy of the transmission of data signal.

The above producing method according to the embodiment, does not need to increase the number of the used masks, does not increase the number of the patterning process, and has low manufacturing costs of the array substrate.

In accordance with an embodiment of the present invention, upon forming a pattern of the pixel definition layer 11, the part located between the bottom plate 9a of the storage capacitor and the top plate 9b of the storage capacitor is produced to have a minimum thickness and may be produced layer by layer. The method may reduce the area the storage capacitor 100' occupies while meeting the requirement of electrical performance of products. It contributes to further optimization of structure.

An embodiment of the present invention also provides a display apparatus including the AMOLED array substrate as described in any of the above embodiments. The display apparatus has a high pixel aperture opening ratio and good display quality. The specific types of the display apparatus are not limited, for example, it may be an AMOLED display, an AMOLED TV or the like.

It would be appreciated by those skilled in the art that various changes or modifications may be made to the present disclosure without departing from the spirit and scope of the present invention. Thus, these changes or modifications will be intended to be comprised in the present invention as long as they fall within the scope of the appended claims of the present application and the equivalent thereof.

What is claimed is:

1. An active matrix organic light-emitting diode array substrate comprising:
   a substrate;
   a plurality of pixel units located on the substrate and arranged in an array, each of the plurality of pixel units comprising a thin film transistor, an organic light-emitting diode and a bottom plate of a storage capacitor, the bottom plate being arranged above a gate electrode of the thin film transistor and electrically connected to the gate electrode of the thin film transistor;
   a pixel definition layer spacing apart two adjacent pixel units from each other; and
   a top plate of the storage capacitor provided on the pixel definition layer, the top plate of the storage capacitor being spaced apart from the bottom plate of the storage capacitor by the pixel definition layer.

2. The array substrate according to claim 1, wherein a top electrode of the organic light-emitting diode and the top plate of the storage capacitor are made from the same material and located in the same layer.

3. The array substrate according to claim 1, wherein the bottom plate of the storage capacitor and a bottom electrode of the organic light-emitting diode are made from the same material and located in the same layer.

4. The array substrate according to claim 1, wherein the bottom plate of the storage capacitor and the gate electrode of the thin film transistor are electrically connected with each other through vias in a first insulation layer.

5. The array substrate according to claim 1, wherein in the pixel definition layer, the part of the pixel definition layer located between the bottom plate of the storage capacitor and the top plate of the storage capacitor has a minimum thickness.

6. The array substrate according to claim 1, wherein the material of the pixel definition layer comprises organic resin or silicon dioxide.

7. The array substrate according to claim 1, wherein the top plate of the storage capacitor is electrically connected to the top electrode of the organic light-emitting diode, or the organic light-emitting diode has a top electrode above the bottom plate of the storage capacitor and the part of the top electrode of the organic light-emitting diode facing the bottom plate severs as the top plate of the storage capacitor.

8. A display apparatus comprising the active matrix organic light-emitting diode array substrate according to claim 1.

9. A method for producing an active matrix organic light-emitting diode array substrate as claimed in claim 1, comprising the following steps of:
   forming a thin film transistor of each pixel unit on a substrate;
   forming a pattern of a bottom plate of a storage capacitor electrically connected with a gate electrode of the thin film transistor of each pixel unit;
   forming a pattern of a pixel definition layer overlaying the bottom plate of the storage capacitor; and
   forming a pattern of a top plate of the storage capacitor on the pixel definition layer.

10. The method according to claim 9, wherein the step of forming the pattern of the top plate of the storage capacitor on the pixel definition layer comprises:
   forming a pattern of a top electrode of the organic light-emitting diode above the pixel definition layer, the top electrode of the organic light-emitting diode comprising a part which faces the bottom plate of the storage capacitor and servers as the top plate of the storage capacitor.

11. The method according to claim 9, further comprising:
   forming a pattern of a bottom electrode of the organic light-emitting diode after the step of forming the thin film transistor of each pixel unit on the substrate, the pattern of the bottom electrode of the organic light-emitting diode and the pattern of the bottom plate of the storage capacitor being formed in the same patterning process.

12. The method according to claim 11, further comprising:
   before forming the pattern of the bottom electrode of the organic light-emitting diode and the pattern of the bottom plate of the storage capacitor, forming a pattern of vias in a first insulation layer connecting the gate electrode of the thin film transistor with the bottom plate of the storage capacitor and a pattern of vias in a second insulation layer connecting a source electrode of the thin film transistor with the bottom electrode of the organic light-emitting diode in the same patterning process.

13. The method according to claim 9, wherein upon forming the pattern of the pixel definition layer, the part located between the bottom plate of the storage capacitor and the top plate of the storage capacitor is produced to have a minimum thickness.

14. The method according to claim 9, wherein the top plate of the storage capacitor is electrically connected to the top electrode of the corresponding organic light-emitting diode.

15. The array substrate according to claim 2, wherein the bottom plate of the storage capacitor and a bottom electrode of the organic light-emitting diode are made from the same material and located in the same layer.

16. The array substrate according to claim 2, wherein the bottom plate of the storage capacitor and the gate electrode of the thin film transistor are electrically connected with each other through vias in a first insulation layer.

17. The array substrate according to claim 3, wherein the bottom plate of the storage capacitor and the gate electrode of the thin film transistor are electrically connected with each other through vias in a first insulation layer.

18. The array substrate according to claim 15, wherein the bottom plate of the storage capacitor and the gate electrode of the thin film transistor are electrically connected with each other through vias in a first insulation layer.

19. The method according to claim 10, further comprising:
forming a pattern of a bottom electrode of the organic light-emitting diode after the step of forming the thin film transistor of each pixel unit on the substrate, the pattern of the bottom electrode of the organic light-emitting diode and the pattern of the bottom plate of the storage capacitor being formed in the same patterning process.

20. The method according to claim 16, further comprising:
before forming the pattern of the bottom electrode of the organic light-emitting diode and the pattern of the bottom plate of the storage capacitor, forming a pattern of vias in a first insulation layer connecting the gate electrode of the thin film transistor with the bottom plate of the storage capacitor and a pattern of vias in a second insulation layer connecting a source electrode of the thin film transistor with the bottom electrode of the organic light-emitting diode in the same patterning process.

* * * * *